(12) United States Patent
Toyoda

(10) Patent No.: US 6,335,785 B1
(45) Date of Patent: *Jan. 1, 2002

(54) SCAN-TYPE REDUCING PROJECTION EXPOSURE METHOD AND APPARATUS

(75) Inventor: Shigehiro Toyoda, Kasugai (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/129,742

(22) Filed: Aug. 5, 1998

(30) Foreign Application Priority Data

Mar. 12, 1998 (JP) ............................................. 10-061716

(51) Int. Cl.⁷ ........................... G03B 27/42; G03B 27/32
(52) U.S. Cl. ........................................... 355/53; 355/77
(58) Field of Search ............................... 355/50, 53, 67, 355/77, 72, 75; 356/399, 400; 430/5, 20, 30, 311, 312

(56) References Cited

U.S. PATENT DOCUMENTS

| | | | | |
|---|---|---|---|---|
| 5,657,130 A | * | 8/1997 | Shirasu et al. | 356/401 |
| 5,667,923 A | * | 9/1997 | Kanata | 430/30 |
| 5,698,346 A | * | 12/1997 | Sugawara | 430/5 |
| 5,792,581 A | * | 8/1998 | Ohnuma | 430/30 |
| 5,796,467 A | * | 8/1998 | Suzuki | 355/53 |
| 5,807,647 A | * | 9/1998 | Hashimoto | 430/5 |
| 5,825,647 A | * | 10/1998 | Tsudaka | 364/167.03 |
| 5,907,392 A | * | 5/1999 | Makinouchi | 355/53 |
| 6,002,487 A | * | 12/1999 | Shirata | 356/400 |
| 6,118,515 A | * | 9/2000 | Wakamoto et al. | 355/53 |

* cited by examiner

Primary Examiner—Russell Adams
Assistant Examiner—Hung Henry Nguyen
(74) Attorney, Agent, or Firm—Staas & Halsey LLP

(57) ABSTRACT

A scan-type reducing projection exposure method, which can reduce the influence of machining errors upon the focusing characteristic of a lens system, by: preparing test patterns distributed in an exposure area; projecting the test patterns onto a photosensitive member, while changing a scan direction of a scan-type reducing projection exposure apparatus; developing the photosensitive member to produce photosensitive patterns; measuring dimensions of predetermined parts of the photosensitive patterns to obtain a distribution of the dimensions of the photosensitive patterns in the exposure areas; determining a scan direction in accordance with dimension distribution obtained in said scanning step; and performing an exposure using the determined scanning direction.

7 Claims, 6 Drawing Sheets

SCAN-TYPE REDUCING PROJECTION EXPOSURE METHOD AND APPARATUS

This application is based on Japanese patent application No. Hei 10-61716 filed on Mar. 12, 1998, the entire contents of which are incorporated herein by reference.

BACKGROUND OF THE INVENTION

1. Field of the Invention

The present invention relates to exposure technique, and more particularly to scan-type reducing projection exposure technique.

In this specification, the term "exposure" indicates forming a latent image on an energy sensitive material through the use of an energy beam. The kind of energy beam is not limited, but is typically ultraviolet light.

2. Description of the Related Art

Fining patterns are desired to improve the integration density of a semiconductor IC device. Improving the resolution and making a focusing characteristic uniform in an exposure area are required to fine the patterns. A scan-type exposure technique has been proposed as an exposure method which permits a projection lens system to be small in size.

The scan-type exposure is a technique by which a pattern on a reticle is projected onto a wafer, with both the reticle and the wafer being moved and scanned relative to the projection lens system. For example, when the projection lens system employs the z-axis as its optical axis and projects an object plane lying in a first x-y plane onto an image plane lying in a second x-y plane at a reduced scale of 1/n, the reticle in the object plane is scanned in Y-direction, and the wafer or the image plane is scanned in -Y-direction at a speed of 1/n. Individual points on the reticle are focused on their corresponding positions on the wafer, with the positional relationship between the reticle and the projection lens system being varied.

The focusing characteristic of the projection lens system is uniformalized by varying the position of an object point relative to the projection lens system. Moreover, in case of the exposure of a rectangular area, the shorter sides of the area need only be located in the field of view of the projection lens system.

As in the case of a spherical surface, a surface of a lens used in an exposure system has rotation-symmetrical about the optical axis. However, lenses are normally formed by machining work such as grinding or the like. Machining work often entails machining errors, which make it difficult to attain perfect rotation symmetry.

A lens having a single spherical surface has not only color aberrations, but also various aberrations such as Seidel's five aberrations. Those aberrations can be improved by using a combination lenses or the like. However, when the lens has machining errors, the occurrence of image deformation due to the machining errors cannot be easily predicted.

FIGS. 6A and 6B are diagrams which schematically illustrate the structure and operation of a scan-type exposure apparatus employing a conventional technique. In FIG. 6A, a projection lens system L1 projects (focuses) a pattern formed on a reticle R1 onto a wafer W1 at a reduced scale of 1/n. When the projection lens system L1 is one which performs the projection on a reduced scale of ¼, for example, it projects the pattern formed on the reticle R1 onto the wafer W1, reducing the pattern size to ¼.

The reticle R1 is driven along, for example, Y-axis shown in the illustration. The wafer W1 is scanned at a speed of 1/n along -Y-axis which is parallel to the Y-axis but extends in the opposite direction to the Y-axis. In other words, when the scan axis of the reticle is Y, the scan axis of the wafer is -Y/n.

As the reticle is scanned in the Y-direction, points P1$a$ and P2$a$ on the reticle also move parallel to each other, and the image points focused by the system L1 also move parallel to each other. Nevertheless, since the wafer W1 is scanned in the -Y/n-direction in synchronization with the movement of the reticle R1, the positions of image points P1$b$ and P2$b$ on the wafer W1 are unchanged relative to the wafer W1.

The above descriptions have been made assuming that the lens system L1 is perfect. In actual cases, however, the lens system L1 incurs the image deformation due to the machining errors, in addition to the aberrations.

FIG. 6B schematically illustrates in enlarged view the deformation of an image projected by the lens system L1 when a batch exposure is effected in a stationary state at one time. If the lens system L1 was perfect, a rectangular pattern on the reticle R1 would be focused on the wafer W1, with the pattern size simply reduced like a pattern PAX shown by a dotted line in FIG. 6B. If the lens system L1 was such an ideal lens system and the scan exposure was performed using the ideal lens system, the image of the point P1$a$ on the reticle would follow the line P/b on the pattern PAX. The image of the point Pa would be transferred onto the wafer W1, without deviating from the ideal position in a direction perpendicular to the scan axis Y. In fact, however, due to the aberrations and manufacturing errors of the lens system L1, the rectangular pattern is focused as a deformed pattern like a pattern PBX shown by a solid line in FIG. 6B when the exposure is effected in the stationary state. The scan exposure, if performed using such a lens system, will entail the following problems when transferring the pattern onto the wafer W1:

Let us consider the case where the scan axis Y runs vertically in the illustration and the scan axis of the wafer W1 is -Y/n. While the reticle R1 is scanned in the Y-direction, the wafer W1 is scanned in the opposite direction, i.e., the -Y/n-direction. If the image of the point P1$a$ on the reticle scanned (traced) a rectangular pattern S shown by a dotted line, the image point P1$b$ on the wafer W1 would not deviate from the ideal position in the direction perpendicular to the scan direction Y.

However, in the case of a focusing characteristic which projects a pattern like the pattern PBX shown by a solid line, the image of the point P1$a$ traces a line P1$b$ during a scan and deviates by "d1" in the horizontal X-direction. Similarly, the image of the point P2$a$ traces a line P2$b$ and deviates by "d2" in the X-direction. Only the image point deviation in the direction perpendicular to the scan direction has been explained above. However, the image point deviation occurs also in a direction parallel to the scan direction.

As regards aberration factors of the lens system, it can be predicted and simulated where and to what degree aberrations will occur and have occurred. It can be predicted what kind of aberration averaging will be performed by scanning the reticle and the wafer and to what extent the resultant image will contain the aberrations. The aberrations are rotation-symmetrical about the optical axis, and the extent of the image deformation occurring at the time of the scan exposure depends on the distance from the optical axis.

When the image deformation is due to the machining errors of the lens system, it is difficult to predict where and to what extent the image deformation will occur. When an scan-type reducing projection exposure apparatus has the lens machining errors, it is difficult to predict where in the exposure area and to what degree the image deformation will occur.

In the case where the projection lens system used in the scan-type reducing projection exposure apparatus has machining errors, those errors adversely influence the focusing characteristic of the lens system. However, a technique for reducing the influence of machining errors has not been known conventionally.

SUMMARY OF THE INVENTION

An object of the present invention is to provide a scan-type reducing projection exposure method for performing a scan-type exposure so as capable of reducing the influence of the lens machining errors upon the focusing characteristic of the lens system.

Another object of the present invention is to provide a scan-type reducing projection exposure apparatus capable of reducing the influence of the lens manufacturing errors on the exposure characteristics.

According to one aspect of the present invention, there is provided a scan-type reducing projection exposure method comprising: a preparing step of preparing a group of test patterns distributed in an exposure area; a projecting step of projecting the group of test patterns onto a photosensitive member, while changing a scan direction of a scan-type reducing projection exposure apparatus; a developing step of developing the photosensitive member to produce a group of photosensitive patterns; a measuring step of measuring dimensions of a predetermined part of the photosensitive patterns to obtain a distribution of the dimension of the photosensitive patterns in the exposure areas; a determining step of determining a scan direction in accordance with dimension distribution obtained in said measuring step; and an exposing step of performing an exposure using the determined scanning direction.

According to another aspect of the present invention, there is provided a scan-type reducing projection exposure apparatus comprising: a reticle table for mounting a reticle; a wafer table for mounting a wafer; an optical system for projecting patterns on the reticle onto the wafer; a first drive table for moving the reticle table in first and second directions; a second drive table for moving the wafer table in the first and second directions; and arithmetic operation means, to which dimensions of patterns are input, for determining a scan direction which permits that differences between the dimensions of the patterns to be minimum.

The influence of the machining errors of a projection optical system can be reduced by actually projecting and developing the test patterns, while changing the scan direction relative to the lens system, measuring differences between the dimensions of the patterns for each scan direction, and determining the optimum scan direction.

Thus, when the projection optical system used in the scan-type reducing projection exposure technique has machining errors, the influence of the machining errors can be reduced.

DETAILED DESCRIPTION OF THE PREFERRED EMBODIMENT

Embodiments of the present invention will now be described with reference to the accompanying drawings.

Figure 1:
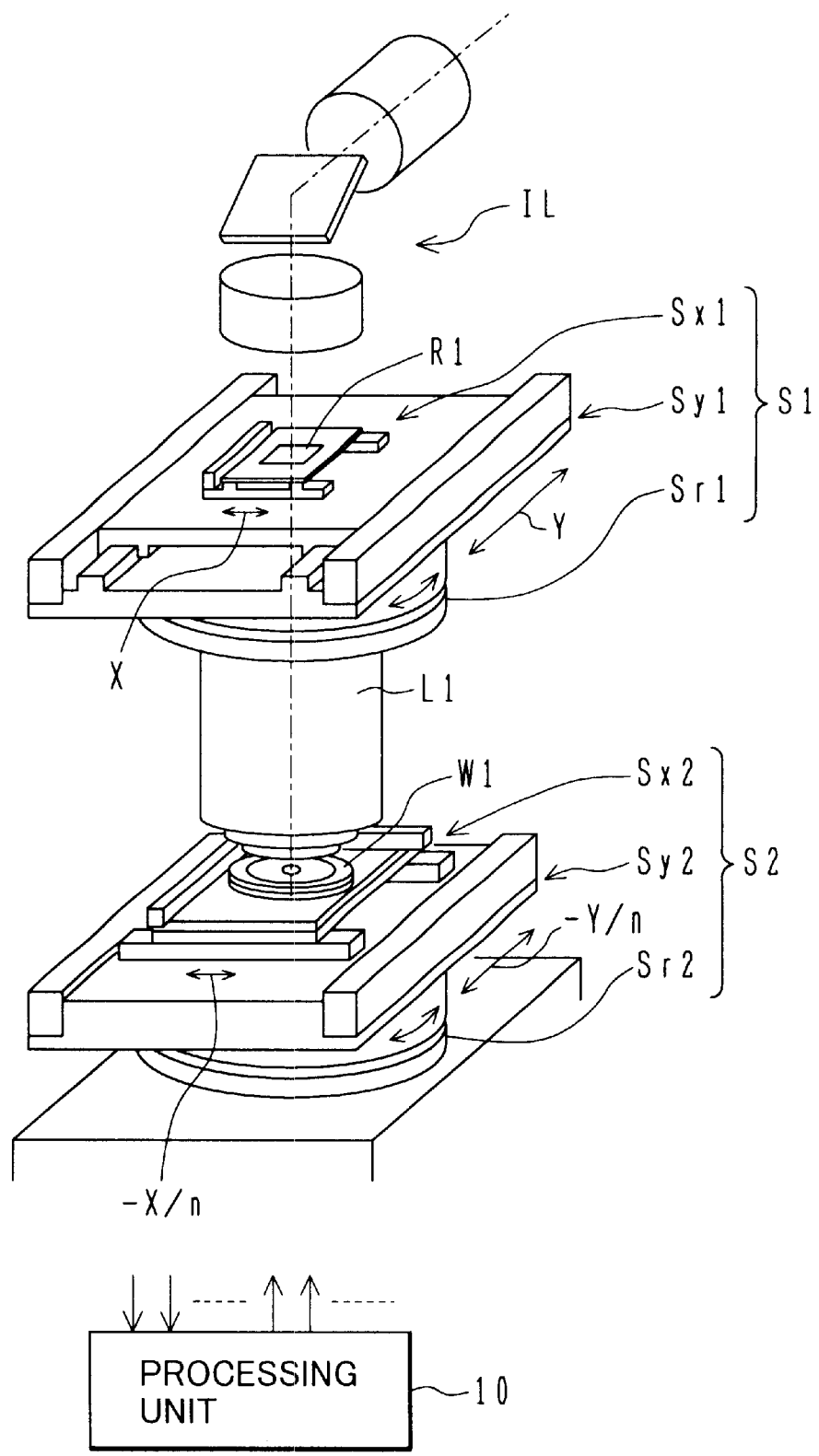
FIG. 1 is a perspective view which schematically illustrates the structure of a scan-type reducing projection exposure apparatus according to one embodiment of the present invention.

FIG. 1 is a perspective view which schematically illustrates the structure of the scan-type reducing projection exposure apparatus according to one embodiment of the present invention. An illumination system IL radiates illumination light from above. A reticle stage S1 includes an X-stage Sx1, a Y-stage Sy1 and a rotating stage Sr1.

A reticle table, on which an reticle R1 is mounted, is a stage on the X-stage Sx1, and is movable along the X-direction. The Y-stage Sy1 supports the X-stage Sx1. The Y-stage Sy1 enables a scan along the Y-direction. The rotating stage Sr1 supports the Y-stage Sy1.

The scan direction of the Y-stage Sy1 can be set arbitrarily by rotating the rotating stage Sr1. The scan direction of the reticle R1 can be changed within a certain range by driving the X-stage Sx1 and the Y-stage Sy1 together and by variably setting their moving speeds.

A reducing projection lens system L1 is arranged under the reticle stage S1. The reducing projection lens system L1 projects a pattern formed on the reticle R1 onto a wafer W1 at a reduced scale.

The wafer W1 is mounted on an X-stage Sx2 which serves as a wafer supporting table, and can be moved along the X-direction via the X-stage Sx2. A Y-stage Sy2 supports the X-stage Sx2. The Y-stage Sy2 enables a scan along the Y-direction. A rotating stage Sr2 supports the Y-stage Sy2.

The X-stage Sx2, the Y-stage Sy2 and the rotating stage Sr2 constitute a wafer stage S2, and enables a scan along an arbitrary direction in an X-Y plane, as in the case of the reticle stage S1. However, since the required range of movement of the wafer stage S2 is "1/n (1/n" of the required range of movement of the reticle stage S1, the required scan speed of the wafer stage S2 is 1/n of the required scan speed of the reticle stage S1.

By virtue of the presence of the rotating stages Sr1 and Sr2, the reticle stage S1 and the wafer stage S2 can be directed in arbitrary directions within a plane, and the direction of a scan can be arbitrarily determined within the plane. It is also possible to rotate the stages S1 and S2 independently from each other. It is also possible to rotate the stages S1 and S2 together with the mutual relation being set parallel (vertically aligned) with each other.

An explanation will now be made as regards the way of selecting a scan direction, depending on the focusing characteristic of the projection lens system L1.

Figure 2A:
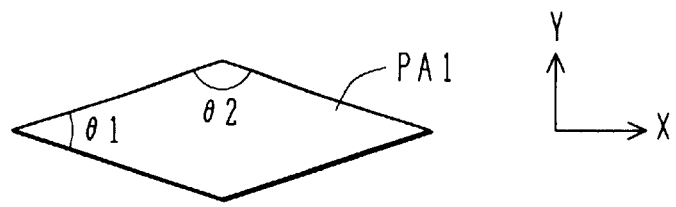
FIGS. 2A, 2B and 2C are plan views which schematically illustrate the shape and arrangement of test patterns used in an embodiment of the present invention.
Figure 2B:
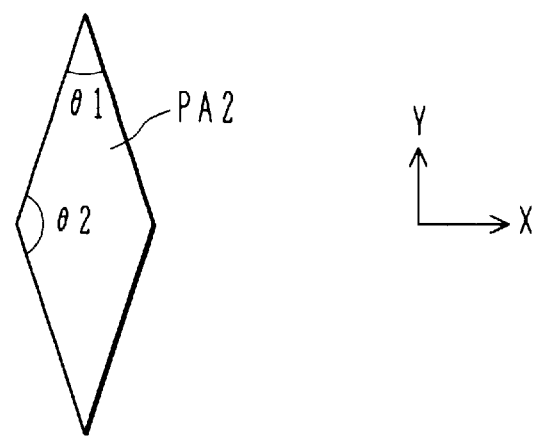
Figure 2C:
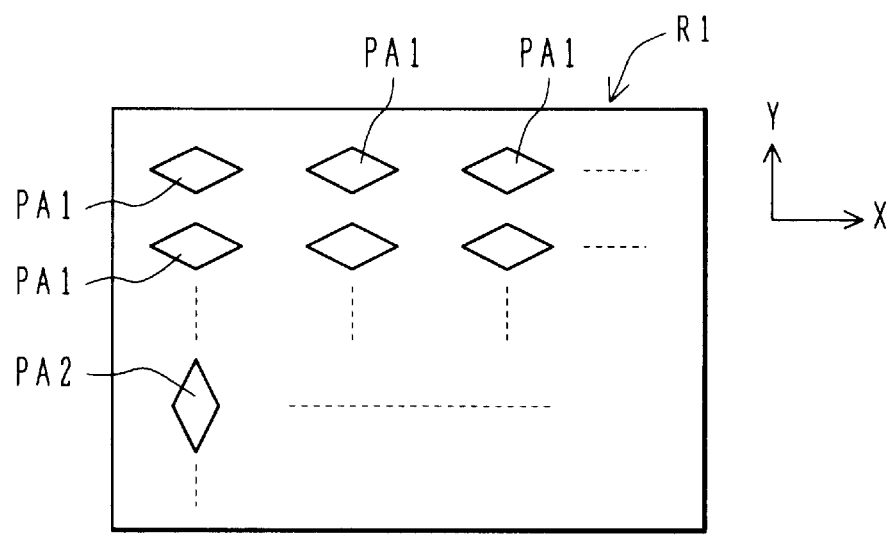

FIGS. 2A to 2C exemplify the shape of a test pattern for checking the quality of a pattern projected by the scan exposure. FIG. 2A illustrates a diamond-shaped pattern PA1 elongated in the X-direction. The apex angle (1 in the direction in which the diamond-shaped pattern is elongated, and the apex angle (2 in a direction perpendicular to the elongated direction of the diamond-shaped pattern, are set at values suitable for measuring to what extent the image deformation occurs due to the image point deviation.

For example, in the case of precisely measuring the image point deviation in a lateral direction, the apex angle θ1 in the elongated direction of the diamond-shaped pattern is preferred to be as small as possible. Under this condition, the apex angle θ2 is inevitably larger than the angle θ1. In the case of precisely measuring the image point deviation along the scan direction, another test pattern is preferably employed in addition to the aforementioned pattern.

FIG. 2B is a diagrammatic plan view of a pattern PA2 suitable for precisely measuring the image point deviation along the scan direction Y. The pattern PA2 is a diamond-shaped pattern elongated vertically. The apex angle θ1 in the Y-direction is set smaller than the apex angle θ2 in the X-direction.

According to a scan-type reducing projection exposure apparatus which performs a scan along the Y-axis, a plurality of patterns, if their positions on the X-axis are identical with each other, will be projected as images of the same nature or characteristics.

FIG. 2C exemplifies the reticle R1 having test patterns formed thereon. Diamond-shaped patterns PA1, elongated in the X-direction, are arranged at equal intervals along the X-direction. In order to improve the measuring precision, the patterns PA1 having the same shape are repetitively arranged in Y-direction with their positions on the X-axis identical with each other. Following the diamond-shaped patterns PA1 elongated in the X-direction, diamond-shaped patterns PA2, elongated in the Y-direction, are arranged in the same manner.

Figure 3A:
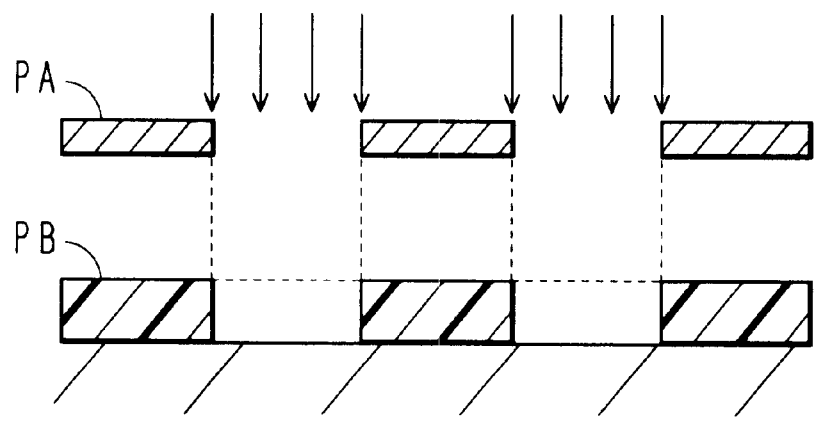
FIGS. 3A, 3B and 3C are diagrammatic sectional views and plan view for explaining the shape of a resist pattern attained by the scan exposure in the case of the presence of the lens machining errors.

FIG. 3A schematically illustrates the state of exposure of the scan-type reducing projection exposure apparatus at a certain moment. The projection lens system projects patterns PA formed on the reticle onto the wafer on a reduced scale. In order to simplify explanations, however, the patterns are illustrated as if an exposure of 1:1 is being performed. Further, the projection lens system is excluded from the illustration. At a certain moment during the exposure, the patterns PA on the reticle are focused on a resist as patterns PB.

Figure 3B:
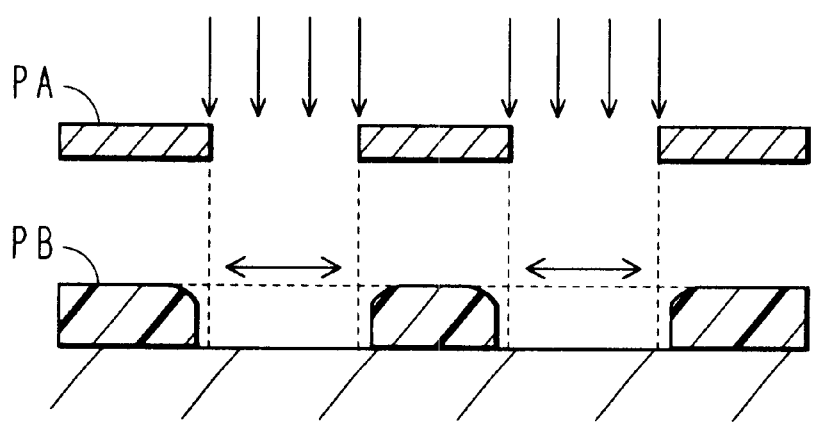

FIG. 3B shows the state wherein changes have occurred in the positions of the reticle R1 and the wafer W1 relative to the lens system L1 as a result of the scan of the reticle R1 and the wafer W1. In the state as illustrated, the images of the patterns PA are projected in the areas shown by dotted lines. However, larger areas on the wafer W1 have already been formed by the exposure effected until then. That is, the positions of the ends of the exposure areas change through the entire scan period.

In the case where the scan direction is perpendicular to a face of the drawing sheet, the illustrated changes in the positions of the ends of the exposure areas represent lateral deviations, whereas in the case where the scan direction is horizontal in the illustration, the illustrated changes in the positions of the ends of the exposure areas represent longitudinal or vertical deviations. The changes in the positions of the ends of the exposure areas cause an edge rounding phenomenon, etc. By making the ends or apexes of the exposure patterns acute, any change in the focusing characteristic of the lens system can be sensitively detected.

Figure 3C:
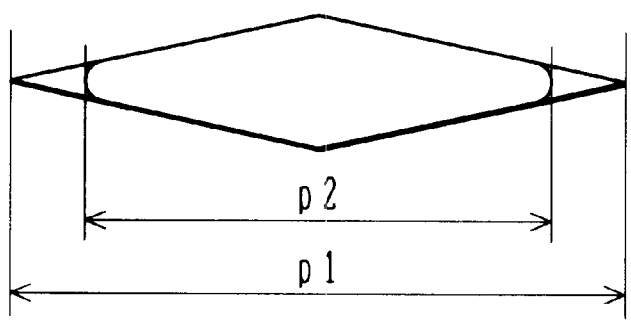

FIG. 3C schematically illustrates the edge rounding phenomenon due to the changes in the positions of the exposure areas. If focusing was effected with perfect accuracy, a diamond-shaped pattern having a length p1 would be projected. However, due to the changes in the positions of the exposure areas, the actually projected pattern has a shorter length p2.

A change in the projected pattern shape differs depending on whether an exposure is positive or negative, whether the amount of exposure is large or small, etc. However, when such a change is due to the lens machining errors, the patterns are projected with their acute ends being rounded off.

According to the scan-type projection exposure apparatus which performs a scan in the Y-direction, patterns whose positions on the axis (X) perpendicular to the scan direction (Y) are identical with each other, are projected via the same lens characteristic. It is therefore preferred that a plurality of test patterns be arranged along the X-direction perpendicular to the scan direction in an exposure area. The test patterns which have the same shape are arranged along the X-direction perpendicular to the scan direction Y, and changes in the dimensions of the patterns are measured. In order to improve the reliability of the measurement, it is preferred that a plurality of patterns having the same shape are arranged along the Y-direction for enabling averaging.

Figure 4:
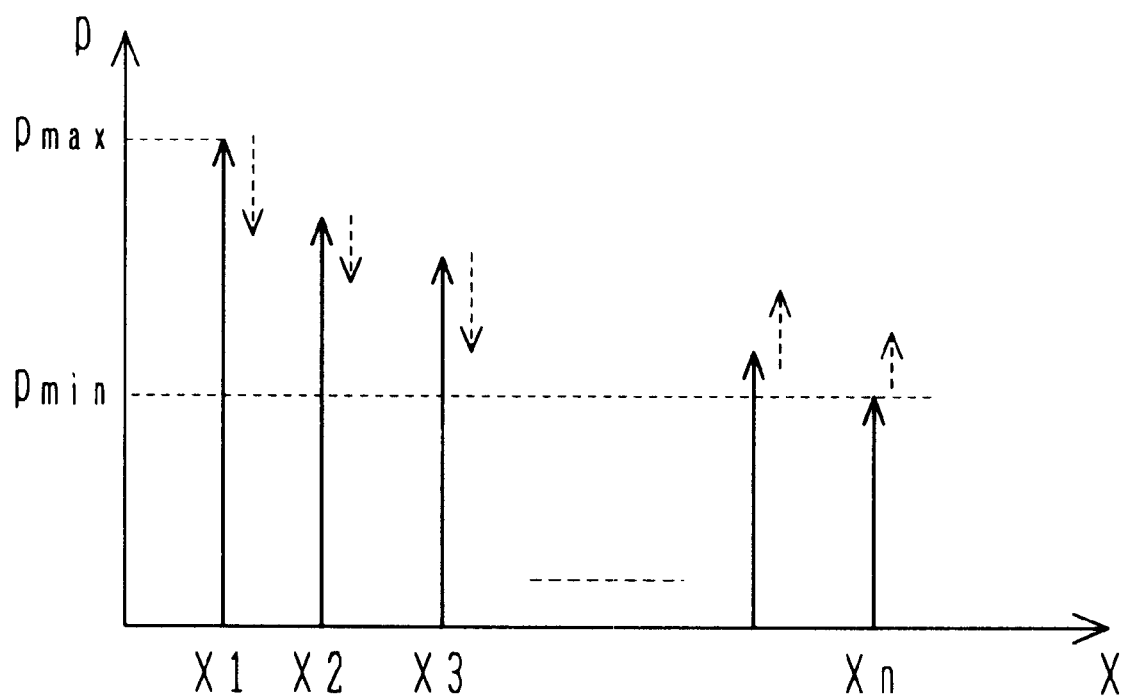
FIG. 4 is a graph for explaining data processing to select the optimum scan direction.

FIG. 4 schematically shows an example of dimension distribution obtained as a result of the measurement. The axis of ordinates indicates the dimensions p of the test patterns, while the axis of abscissas indicates their positions Xi on the reticle in the X-direction. Let it be assumed that when a plurality of patterns are arranged along the scan direction (i.e., along the Y-direction), the dimensions of the patterns are averaged. The measured results are plotted as solid lines as shown in the graph of FIG. 4. In order to make the graph easy to see, the solid lines extending from the axis of abscissas may be sorted according to the ascending or descending order of the pattern dimensions. In FIG. 4, the solid lines are sorted in the descending order of the pattern dimensions.

According to the characteristic shown in the graph (in the case of a first scan direction), the dimensions of the patterns which should be equal in size to each other vary between the maximum value $p_{max}$ and the minimum value $p_{min}$.

Next, the rotating stages Sr1 and Sr2 are rotated in the same direction through a predetermined angle so that the scan direction relative to the projection lens system is changed, and a second scan exposure is effected employing the patterns having the same shape. When the scan direction is changed, variations occur in the exposure characteristic as shown by broken lines in the graph. The maximum dimension $p_{max}$ decreases, and the minimum dimension $p_{min}$ increases. That is, differences in the dimensions of the patterns which should be equal in size to each other are reduced as a whole. This shows that the image quality attained in the case of the second scan direction is higher than that attained in the case of the first scan direction. Similar measurements are repeated changing the scan direction. A direction at which the measured differences in the dimensions of the patterns become minimum, is selected as the optimum scan direction. Those procedures can be performed using a processing unit 10.

In this way, the test patterns having the same shape are projected in a desired angular range of the scan direction, and the dimensions of the projected patterns are measured. A direction at which the maximum pattern dimension becomes minimum or that the minimum pattern dimension becomes maximum, is selected as the optimum scan direction. A selection criterion can be determined based on the type of exposure such as a positive or negative resist, an extracted (apertured) or residual pattern, etc.

According to the scan-type reducing projection exposure apparatus illustrated in FIG. 1, the reticle stage and the wafer stage can be rotated through 360 degrees in an X-Y plane. In many cases, however, the optimum scan direction can be found without rotating the scan direction in such a wide angular range.

Figure 5:
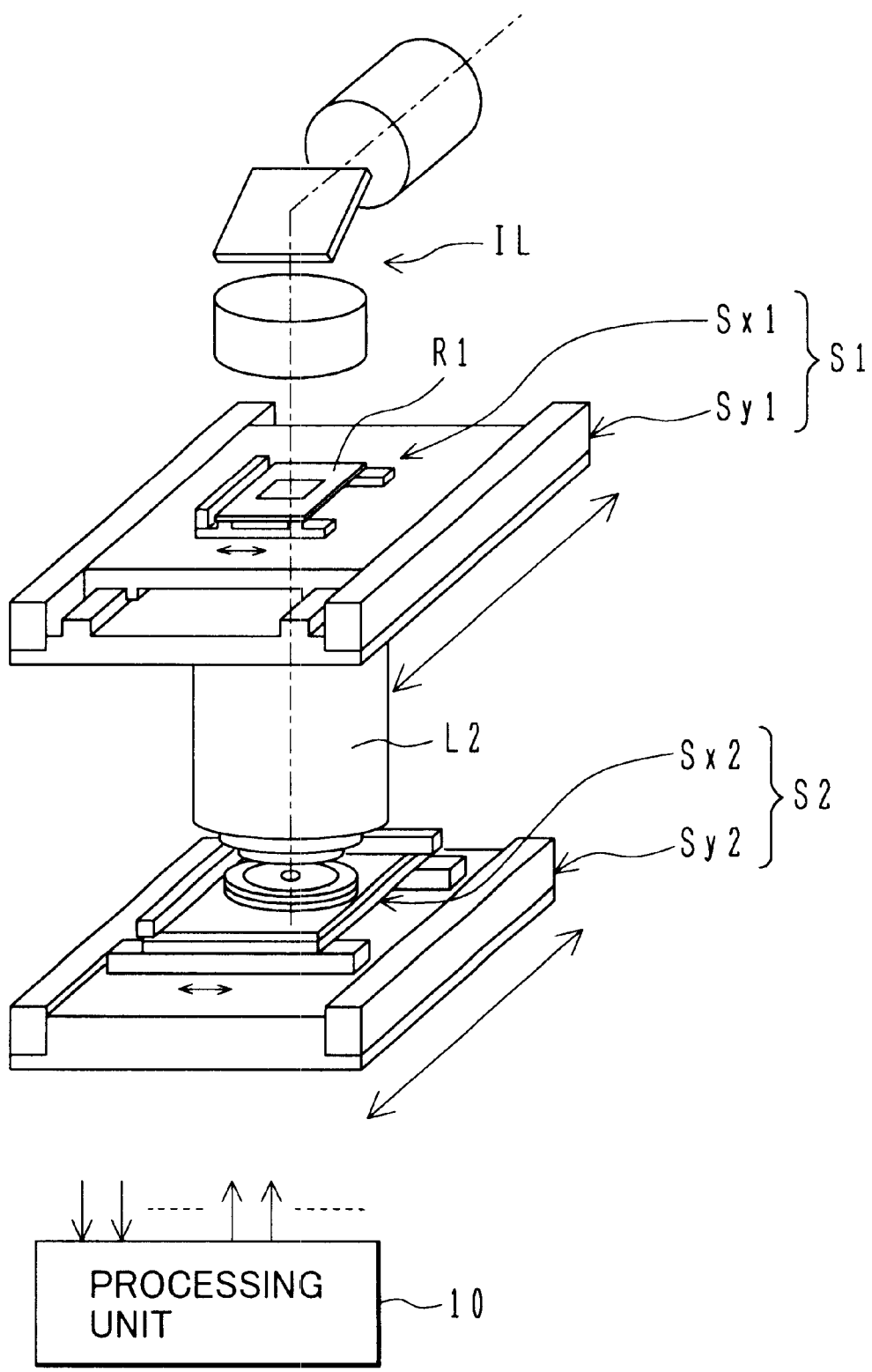
FIG. 5 is a diagrammatic perspective view of a scan-type reducing projection exposure apparatus according to another embodiment of the present invention.
Figure 6A:
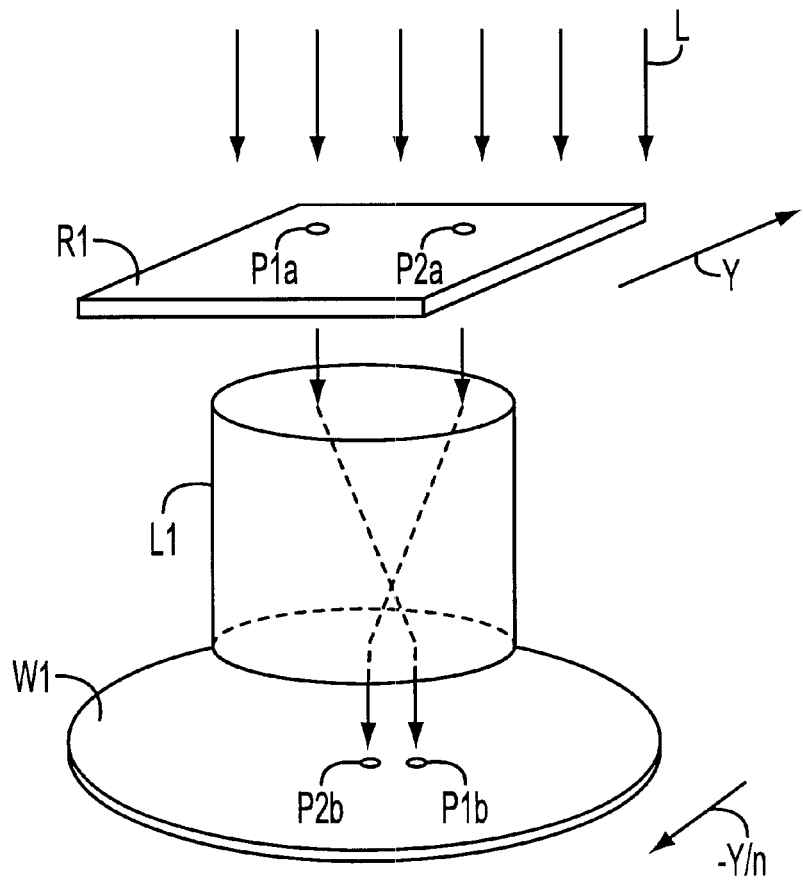
FIGS. 6A and 6B are a diagrammatic perspective view and a diagrammatic plan view for explaining a conventional scan-type reducing projection exposure technique.
Figure 6B:
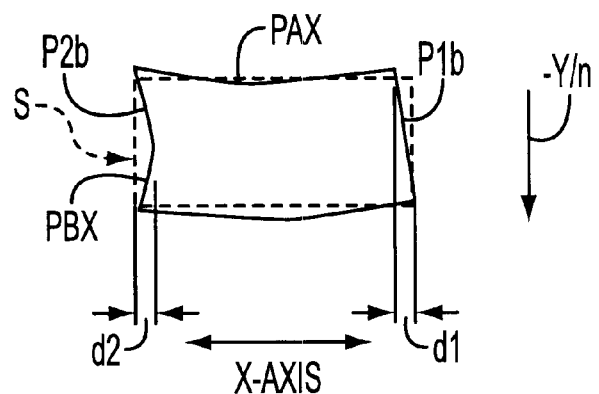

FIG. 5 illustrates an example of the structure of a scan-type reducing projection exposure apparatus according to another embodiment of the present Invention. In this embodiment, the reticle stage S1 includes the X-stage Sx1 and the Y-stage Sy1, while the wafer stage S2 includes the X-stage Sx2 and the Y-stage Sy2. Other structures are the same as those of the scan-type reducing projection exposure apparatus illustrated in FIG. 1. According to this embodiment, the selection of the scan direction is performed by selecting the ratio of the scan speed of the X-stage Sx to the scan speed of the Y-stage Sy. Accordingly, the angular range of scan directions which can be selected is determined by the range of selection of the ratio of the scan speed of the X-stage Sx to the scan speed of the Y-stage Sy.

The exposure apparatuses illustrated in FIGS. 1 and 5 can control the reticle stage S1 and the wafer stage S2 independently from each other, and therefore can move the reticle stage S1 and the wafer stage S2 in nonparallel directions. That is, it is not required that the scan directions of the reticle stage S1 and the wafer stage S2 are kept in parallel and changed relative to the projection lens, but that the scan direction of only the reticle stage S1 or the wafer stage S2 may be changed.

For example, after the determination of the optimum scan directions of the reticle stage S1 and wafer stage S2 in the mode of scanning the reticle stage S1 and the wafer stage S2 in parallel directions, the scan direction of only the reticle stage S1 may be additionally changed to detect an optimum scan direction, and then the scan direction of only the wafer stage S2 may be changed to detect an optimum scan direction. A similar measurement can be repeated if necessary.

The optimum scan direction can be determined also in the case where the focusing characteristic of the lens system contains a component of rotation about the optical axis as a whole.

Embodiments of the present invention have been explained above. However, the present invention is not limited to those embodiments. For example, the shape of the test patterns is not limited to the aforementioned diamond shape, and an arbitrary shape optimum for measurements can be selected. Furthermore, not only the dimensions of the projected patterns when seen in plan view, but also other parameters, such as cross sections of the projected patterns, may be measured to check the qualities of the images obtained by an exposure. An optical system which uses a reflecting mirror in place of a transmission lens, may also be adopted. It will be apparent for those skilled in the art that various modification, improvements and combinations can be made.

What is claimed is:

1. A scan-type reducing projection exposure method comprising:
    a preparing step of preparing a group of test patterns distributed in an exposure area;
    a projecting step of projecting said group of test patterns mounted on a reticle stage onto a photosensitive member mounted on a wafer stage through a projection lens, while changing a scan direction of said stages in an X-Y plane perpendicular to an optical axis of the projection lens, in a scan-type reducing projection exposure apparatus;
    a developing step of developing said photosensitive member to produce a group of developed patterns;
    a measuring step of measuring dimensions of a predetermined part of said developed patterns to obtain a distribution of the dimension of said photosensitive patterns in said exposure area;
    a determining step of determining a scan direction in accordance with dimension distribution obtained in said measuring step; and
    an exposing step of performing an exposure using the determined scanning direction,
    wherein said determining step includes a step of determining a scan direction which permits reduction in the differences between dimensions, of said developed patterns.

2. The scan-type reducing projection exposure method according to claim 1, wherein said group of test patterns includes patterns whose elongated directions are different from each other and being arranged on a line parallel to the scan direction.

3. The scan-type reducing projection exposure method according to claim 2, wherein the directions in which said patterns are elongated include directions which are orthogonal to each other.

4. The scan-type reducing projection exposure method according to claim 1, wherein said determining step includes a step of determining a scan direction which makes a maximum value of the dimension minimum.

5. The scan-type reducing projection exposure method according to claim 1, wherein said determining step includes a step of determining a scan direction which makes a minimum value of the dimension maximum.

6. The scan-type reducing projection exposure method according to claim 1, wherein a scan direction of said reticle stage and a scan direction of said wafer stage are nonparallel to each other.

7. A scan-type reducing projection exposure method, for correcting lens distortion in a scan-type reducing projection exposure apparatus having a reticle stage, a wafer stage and a reducing projection optical system, said method comprising the steps of setting a linear scan direction of said reticle stage and a linear scan direction of said wafer stage in a nonparallel relation to each other on a plane perpendicular to an optical axis of the reducing projection optical system, and projecting an image of a reticle, mounted on said reticle stage being linearly scanned, onto a photosensitive member provided on a wafer mounted on said wafer stage being linearly scanned.

* * * * *